(12) United States Patent
Lee

(10) Patent No.: US 6,232,812 B1
(45) Date of Patent: May 15, 2001

(54) INTEGRATED CIRCUIT DELAY LINES HAVING PROGRAMMABLE AND PHASE MATCHING DELAY CHARACTERISTICS

(75) Inventor: Jung-bae Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/196,994

(22) Filed: Nov. 20, 1998

(30) Foreign Application Priority Data

Nov. 21, 1997 (KR) .................................................. 97-62042

(51) Int. Cl.[7] ...................................................... H03H 11/26
(52) U.S. Cl. ........................ 327/277; 327/161; 327/270; 375/375; 365/189.07
(58) Field of Search .................................... 327/261, 263, 327/269, 270, 271, 276, 277, 284, 291, 158, 295, 149–150, 153, 161, 182–183; 331/25, 1 A; 375/373–376; 365/189.07, 233, 233.5

(56) References Cited

U.S. PATENT DOCUMENTS

| | | | |
|---|---|---|---|
| 4,755,704 | * | 7/1988 | Flora et al. ........................... 327/152 |
| 4,868,514 | * | 9/1989 | Azevedo et al. ..................... 327/159 |
| 5,049,766 | * | 9/1991 | Van Driest et al. ................. 327/269 |
| 5,451,894 | * | 9/1995 | Guo ....................................... 327/241 |
| 5,901,190 | * | 5/1999 | Lee ....................................... 375/373 |

OTHER PUBLICATIONS

Okajima et al., "Digital Delay Locked Loop and Design Technique for High–Speed Synchronous Interface", IEEE Trans. Electron., vol. E79–Cc, No. 6, Jun. 1996, pp. 798–807.

* cited by examiner

Primary Examiner—Timothy P. Callahan
Assistant Examiner—Minh Nguyen
(74) Attorney, Agent, or Firm—Myers Bigel Sibley & Sajovec

(57) ABSTRACT

Programmable delay lines include a delay circuit having an input and a plurality of outputs which each provide a respective delayed version of a periodic input signal provided to the input. A delay switch is also provided to pass at least one of the plurality of outputs of the delay circuit to a switch output, in response to a digital control signal (P1–Pn). A preferred phase comparing circuit is also provided. This phase comparing circuit compares the input signal against the delayed versions of the input signal (at the plurality of outputs) and generates a digital phase signal (F1–Fn) that identifies which of the delayed versions of the input signal is in-phase with the input signal. The programmable delay line also includes a pointer which generates the digital control signal in response to the digital phase signal and a plurality of pointer control signals (S0, S1 and WS).

17 Claims, 7 Drawing Sheets

INTEGRATED CIRCUIT DELAY LINES HAVING PROGRAMMABLE AND PHASE MATCHING DELAY CHARACTERISTICS

RELATED APPLICATION

This application is related to Korean Application No. 97-62042, filed Nov. 21, 1997, the disclosure of which is hereby incorporated herein by reference.

FIELD OF THE INVENTION

The present invention relates to integrated circuit devices, and more particularly to integrated circuits having delay lines therein.

BACKGROUND OF THE INVENTION

In a synchronous DRAM device, the time delay for generating output data in response to a read command received in synchronization with a clock is generally equal to a CAS latency (CL) times a clock period (tCK) plus an access time (tAC). Here, the CAS latency is generally an integer multiple or a half integer multiple of the clock period tCK. However, as the scale of integrated circuits and systems become larger, the delay time associated with the output of data in a synchronous DRAM must be carefully and variably controlled. In particular, in a system containing a DRAM controller and a plurality of synchronous DRAM devices electrically coupled thereto, it would preferable if the delay time associated with the output of data from each DRAM device could be independently controlled to inhibit the likelihood of simultaneous arrival of large quantities of data at the DRAM controller.

To provide independent control of the delay time, integrated circuit delay lines have been proposed. In an integrated circuit delay line which can be programmed, coarse programmable delay and fine programmable delay can typically be separately controlled. The coarse programmable delay is typically an integer or one-half integer multiple of the period T of an input clock CLK, and the fine programmable delay is less than an integer or one-half integer multiple of the period T. An exemplary delay line is disclosed in an article by Y. Okajima et al. entitled "Digital Delay Locked Loop and Design Technique for High-Speed Synchronous Interface", IEICE Trans. Electron., Vol. E79-C, No. 6, pp. 798–807, June (1996). Unfortunately, the timing of the coarse and fine delays may be influenced by changes in operating voltage, temperature and process variations. Thus, there continues to be a need for integrated circuit delay lines having improved characteristics.

SUMMARY OF THE INVENTION

It is therefore an object of the present invention to provide improved integrated circuit delay lines.

It is a further object of the present invention to provide programmable integrated circuit delay lines.

It is still a further object of the present invention to provide programmable integrated circuit delay lines which can match the full or half-period of an input clock, even if operating voltages, temperature or process variations influence the timing of the input clock.

These and other objects, advantages and features of the present invention are provided by programmable delay lines which include a delay circuit having an input and a plurality of outputs (D1–Dn) which each provide a respective delayed version of a periodic input signal provided to the input. A delay switch is also provided to pass one of the plurality of outputs of the delay circuit to a switch output, in response to a digital control signal (P1–Pn). A preferred phase comparing circuit is also provided. This phase comparing circuit compares the input signal against the delayed versions of the input signal (at the plurality of outputs D1–Dn) and generates a digital phase signal (F1–Fn) that identifies which of the delayed versions of the input signal is in-phase with the input signal. The programmable delay line also includes a pointer which generates the digital control signal in response to the digital phase signal and a plurality of pointer control signals (S0, S1 and WS).

According to a preferred embodiment of the present invention, the programmable delay line further includes a first comparator which generates a first equivalence signal (QWD) in a first logic state (e.g., logic 1) if the digital phase signal (F1–Fn) is equivalent to the digital control signal (P1–Pn). A second comparator is also provided which generates a second equivalence signal (QWU) if the digital control signal indicates an initialized state of the pointer (e.g., when P1=1). A command decoder is also provided which generates the plurality of pointer control signals in response to up and down command signals (UP, DOWN) and the first and second equivalence signals (QWD, QWU). According to a preferred aspect of the present invention, the plurality of pointer control signals (S0, S1, WS) cause the pointer to become initialized (P1–Pn=10 . . . 00) if the up command signal (UP) is applied to the command decoder while the first equivalence signal (QWD) is in the first logic state. The plurality of pointer control signals also preferably cause the pointer to become initialized (e.g., reset) if the up and down command signals are simultaneously applied to the command decoder. Alternatively, the plurality of pointer control signals will cause the pointer to be loaded with the digital phase signal (F1–Fn) if the down command signal (DOWN) is applied to the command decoder while the second equivalence signal (QWU) is in the first logic state.

According to other preferred aspects of the present invention, the delay circuit comprises a plurality of serially connected delay units, the phase comparing circuit comprises a plurality of phase comparators and each phase comparator comprises a latch having a data input which can be electrically connected to a respective one of the outputs of the delay circuit. Each phase comparator may also comprises a pair of transmission gates, with one transmission gate turning-on when the periodic input signal transitions from 0→1 and the other transmission gate turning-on when the periodic input signal transitions from 1→0. The pointer may also comprise a plurality of multiplexers configured so that an input of each of the plurality of multiplexers receives a respective bit of the digital phase signal (F1–Fn) when a pointer control signal (e.g., WS) is in a first logic state and receives a logic 1 or logic 0 reference signal when the first pointer control signal is in a second logic state, opposite the first logic state. The pointer may also comprise a plurality of latches configured so that each of the plurality of latches has a data input electrically coupled to an output of a respective multiplexer and a clock input electrically coupled to the input of the delay circuit.

Description of Preferred Embodiments

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
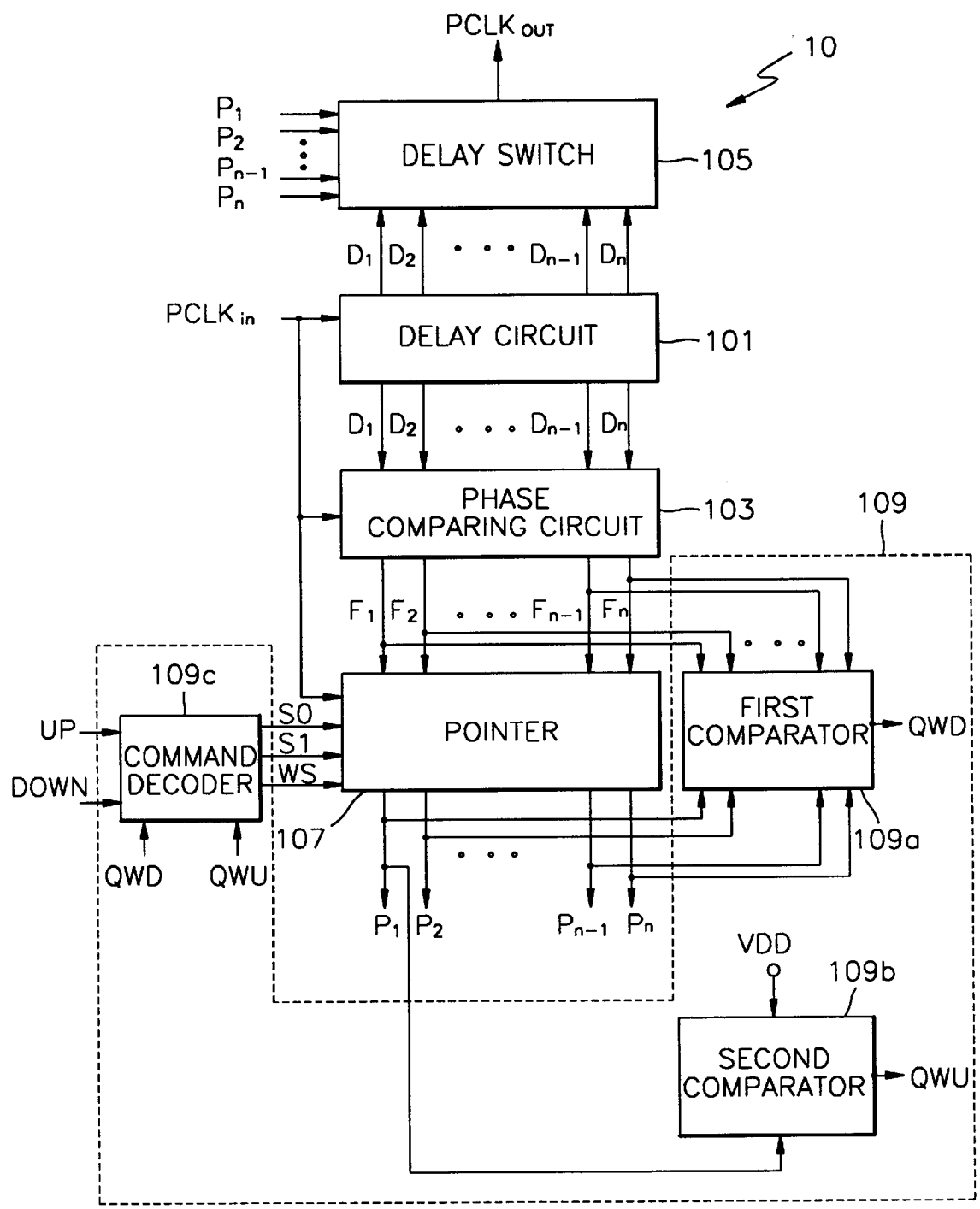
FIG. 1 is block diagram of a programmable delay line according to an embodiment of the present invention.

Referring now to FIG. 1, a programmable delay line 10 according to an embodiment of the present invention will be described. As illustrated, the programmable delay line 10 includes a delay circuit 101 having an input for receiving a periodic input signal (e.g., PCLKin) and a plurality of outputs (D1–Dn) which each provide a respective delayed version of the periodic input signal provided to the input. A delay switch 105 is also provided to pass at least one of the plurality of outputs (D1–Dn) of the delay circuit 101 to a switch output (e.g., PCLKout), in response to a digital control signal (P1–Pn). A preferred phase comparing circuit 103 is also provided. This phase comparing circuit 103 compares the input signal (e.g., PCLKin) against the delayed versions of the input signal (at the plurality of outputs D1–Dn)) and generates a digital phase signal (F1–Fn). This digital phase signal F1–Fn can be used to identify which of the delayed versions of the input signal is in-phase with the input signal. The programmable delay line 10 also includes a pointer 107 which generates the digital control signal (P1–Pn) in response to the digital phase signal (F1–Fn) and a plurality of pointer control signals (S0, S1 and WS).

The programmable delay line 10 further includes a control circuit 109 which includes a first comparator 109a. As described more fully hereinbelow, the first comparator 109a generates a first equivalence signal (QWD) in a first logic state (e.g., logic 1) if the digital phase signal (F1–Fn) is equivalent to the digital control signal (P1–Pn). The control circuit 109 also includes a second comparator 109b which generates a second equivalence signal (QWU) if the digital control signal indicates an initialized state of the pointer (e.g., when P1=1). A command decoder 109c is also provided in the control circuit 109. The command decoder 109c generates the plurality of pointer control signals (S0, S1 and WS) in response to up and down command signals (UP, DOWN) and the first and second equivalence signals (QWD, QWU). As described more fully hereinbelow with respect to FIGS. 7–8 and Table 1, the plurality of pointer control signals (S0, S1, WS) cause the pointer 107 to become initialized (P1–Pn=10 . . . 00) if the up command signal (UP) is applied to the command decoder 109c while the first equivalence signal (QWD) is in the first logic state (e.g., logic 1). The plurality of pointer control signals also preferably cause the pointer 107 to become initialized (e.g., reset) if the up and down command signals are simultaneously applied to the command decoder 109c. The plurality of pointer control signals will also cause the pointer 107 to be loaded with the digital phase signal (F1–Fn) if the down command signal (DOWN) is applied to the command decoder 109c while the second equivalence signal (QWU) is in the first logic state.

Figure 2:
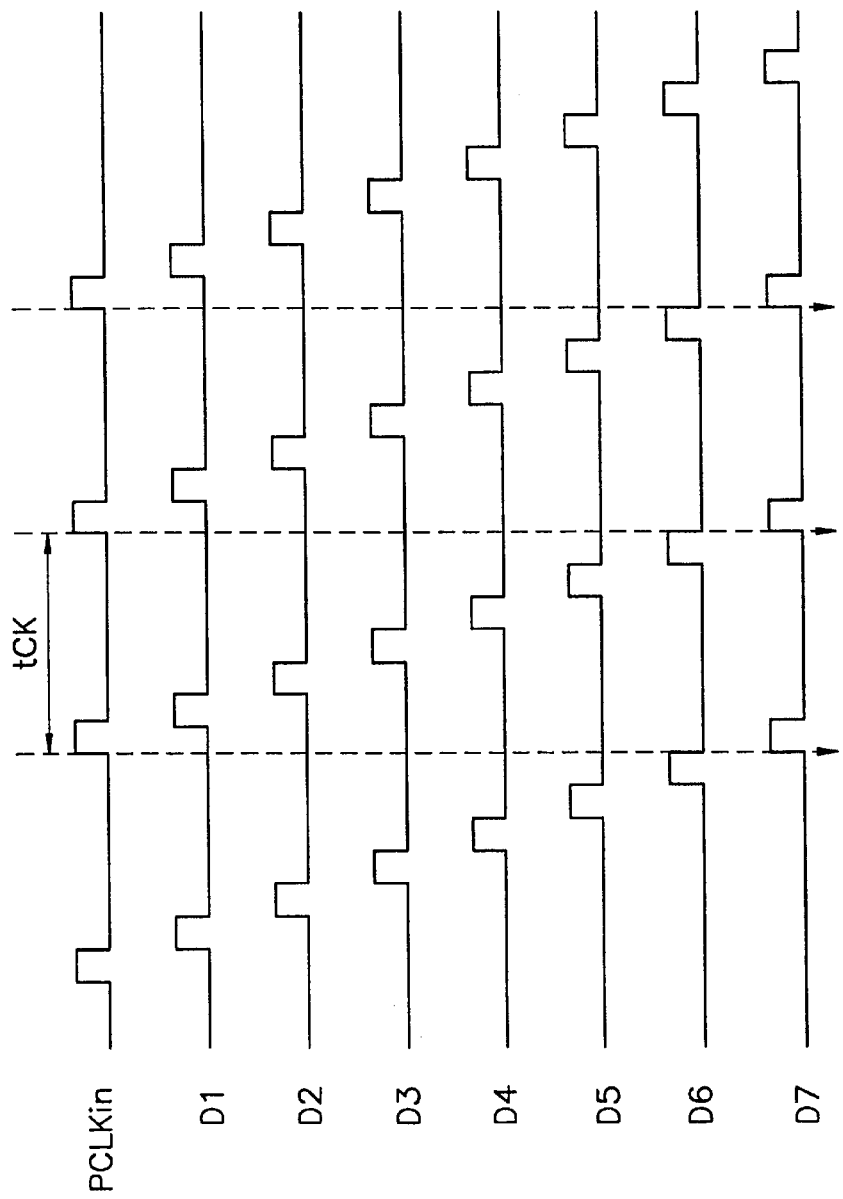
FIG. 2 is a timing diagram which illustrates the timing of an input signal PCLKin and the timing of output signals D1–D7 generated by the delay circuit of FIG. 1.
Figure 3:
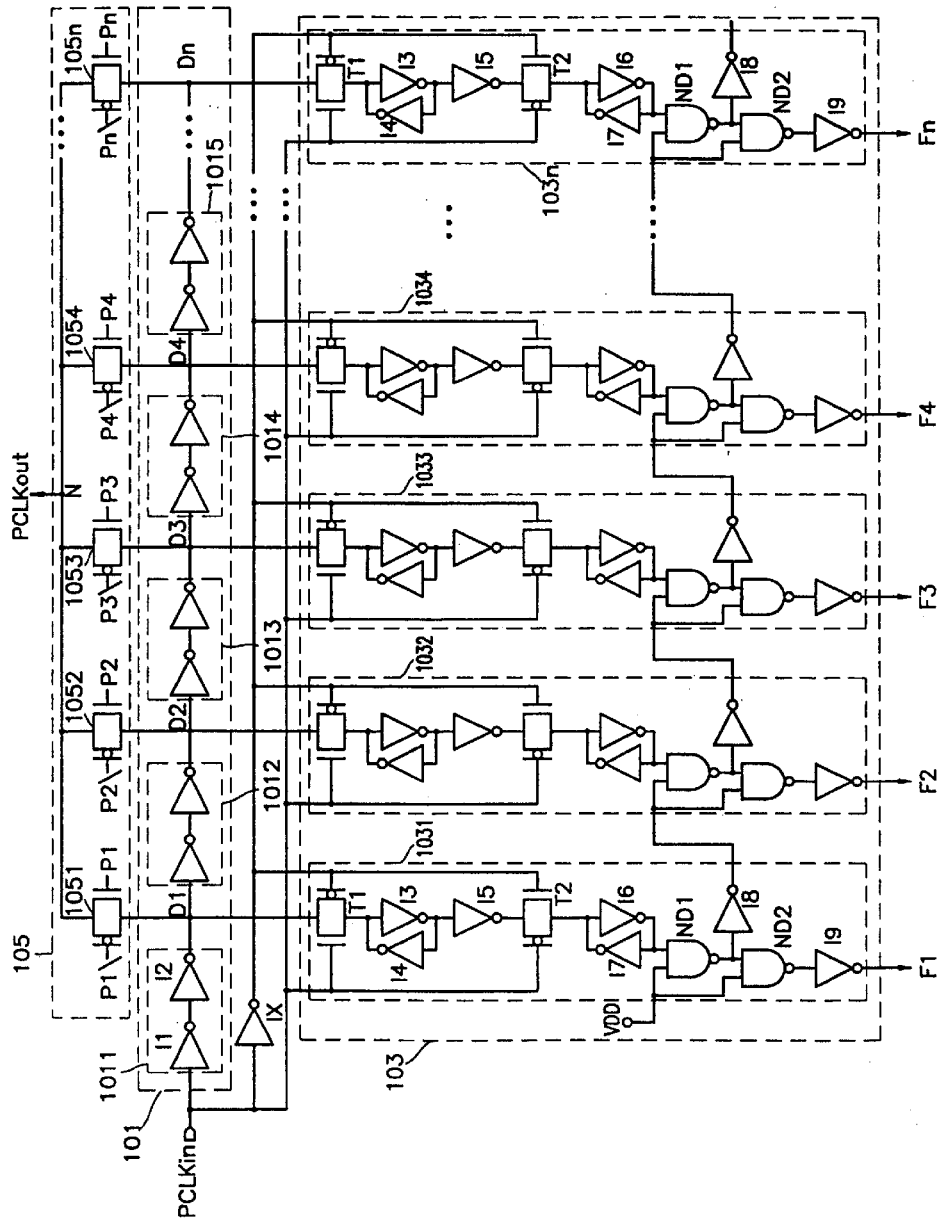
FIG. 3 is an electrical schematic of the delay switch, delay circuit and phase comparing circuit of FIG. 1.

Referring now to FIG. 3, an electrical schematic of the delay switch 105, the delay circuit 101 and the phase comparing circuit 103 of FIG. 1 is provided. As illustrated best by FIG. 3, the delay circuit 101 comprises a plurality of serially connected delay units 1011–1015 with each delay unit comprising a pair of inverters (I1–I2). If each delay unit provides the same amount of delay, then output D1 will generate an output which is delayed by an amount Δt relative to PCLKin and outputs D2, D3 and D4 and Dn will generate respective output signals which are delayed by amounts equal to 2Δt, 3Δt, 4Δt and nΔt, respectively. Moreover, if seven (7) delay units are provided and each delay unit provides a delay $\Delta t=(\frac{1}{6})T_{CK}$, where $T_{CK}$ is the period of the signal PCLKin, then the seventh output D7 will provide a signal which is in-phase with signal PCLKin, as illustrated by FIG. 2. This in-phase signal at the output D7 can be selected by the delay switch 105 if the digital control signal P1–Pn is set to 0000001. As illustrated, the delay switch may comprise a plurality of transmission gates 1051–105n which are controlled by the digital control signal. When turned on, each of these transmission gates enables a respective output (D1–D7) to be passed as signal PCLKout.

The phase comparing circuit 103 can also be used to quickly and accurately identify which of the outputs D1–Dn is generating a signal which is in-phase with signal PCLKin. As illustrated, the phase comparing circuit 103 comprises a plurality of phase comparators 1031–103n and each phase comparator generates a logic 1 output as a bit of a digital phase signal F1–Fn if its respective input (i.e., output D1–Dn of the delay circuit 101) is in-phase with the signal PCLKin. In particular, the first phase comparator 1031 comprises a pair of transmission gates T1 and T2, inverters I3–I9 and NAND gates ND1–ND2 connected as illustrated. Based on this configuration, a 0→1 transition of signal PCLKin will cause transmission gate T1 to open and transmission gate T2 to close. Here, the inverter 1X can be used to invert signal PCLKin, and the output of the inverter 1X is provided to the complementary and true inputs of transmission gates T1 and T2, respectively. Once transmission gate T1 is open, the signal at the output D1 of the delay circuit 101 will be passed to the latch formed by inverters I3 and I4. The output of inverter I3 will then be passed thru inverter I5. Accordingly, if the output D1 is not in-phase with signal PCLKin, then the output of inverter I5 will be set to a logic 0 potential when signal PCLKin transitions from 0→1. However, if the output D1 is in-phase with signal PCLKin, then the output of inverter I5 will be set to a logic 1 potential when signal PCLKin transitions from 0→1. Next, a returning 1→0 transition (i.e., falling edge) of signal PCLKin will cause transmission gate T2 to pass the output of inverter I5 to the input of the latch defined by inverters I6 and I7. Here, again, if the output D1 is not in-phase with signal PCLKin, then the input of NAND gate ND1 will receive a logic 1 potential and the output of NAND gate ND1 will be driven to a logic 0 potential. This logic 0 potential at the output of NAND gate ND1 will then drive the output of NAND gate ND2 to a logic 1 potential and the output of inverter I9 (i.e., output F1) to a logic 0 potential. Thus, a logic 0 signal at the output F1 will indicate that the output D1 of the delay circuit 101 is not in-phase with signal PCLKin.

In contrast, if the output D1 is in-phase with signal PCLKin, then the input of NAND gate ND1 will receive a logic 0 potential and the output of NAND gate ND1 will be driven to a logic 1 potential. This logic 1 potential at the output of NAND gate ND1 will then drive the output of NAND gate ND2 to a logic 0 potential and the output of inverter I9 (i.e., output F1) to a logic 1 potential. Thus, a logic 1 signal at the output F1 will indicate that the output D1 of the delay circuit 101 is in-phase with signal PCLKin. A similar analysis with respect to the other phase comparators 1032 to 103n will also reveal that only one of the bits of the digital phase signal F1–Fn will be set to a logic 1 potential at a given time and that this bit indicates which of the outputs D1–Dn of the delay circuit is in-phase with the signal PCLKin.

Figure 4:
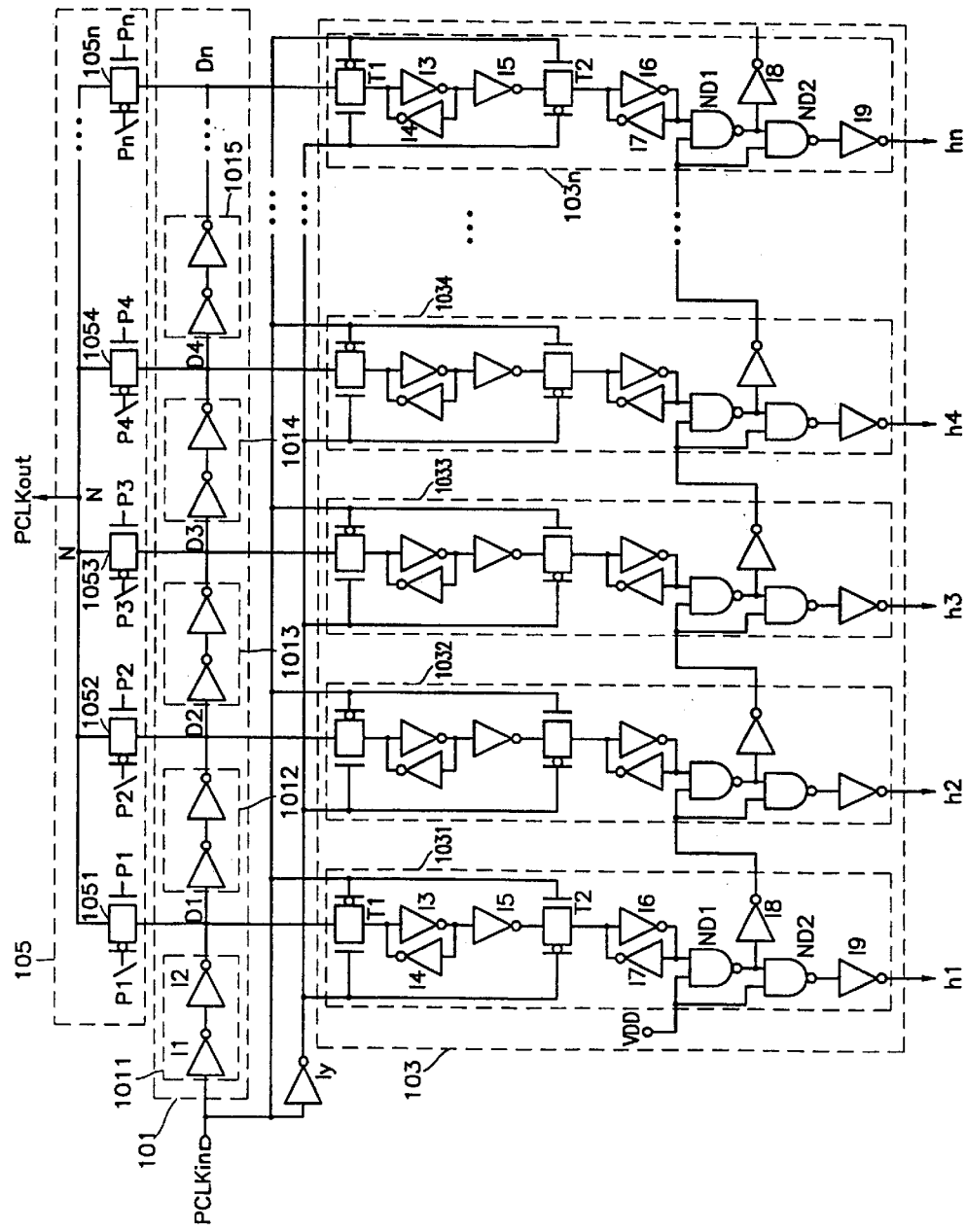
FIG. 4 is an electrical schematic of the delay switch, delay circuit and an alternative phase comparing circuit of FIG. 1.

Referring now to FIG. 4, an electrical schematic which is similar to FIG. 3 is illustrated. Here, however, the inverter 1X of FIG. 3 is replaced by inverter 1Y which has an output electrically connected to the true and complementary inputs of transmission gates T1 and T2. Accordingly, if the signal PCLKin has a duty cycle of 50%, then the digital phase signal F1–Fn will designate which of the outputs D1–Dn is out-of-phase by $(\tfrac{1}{2})T_{CK}$ relative to PCLKin.

Figure 5:
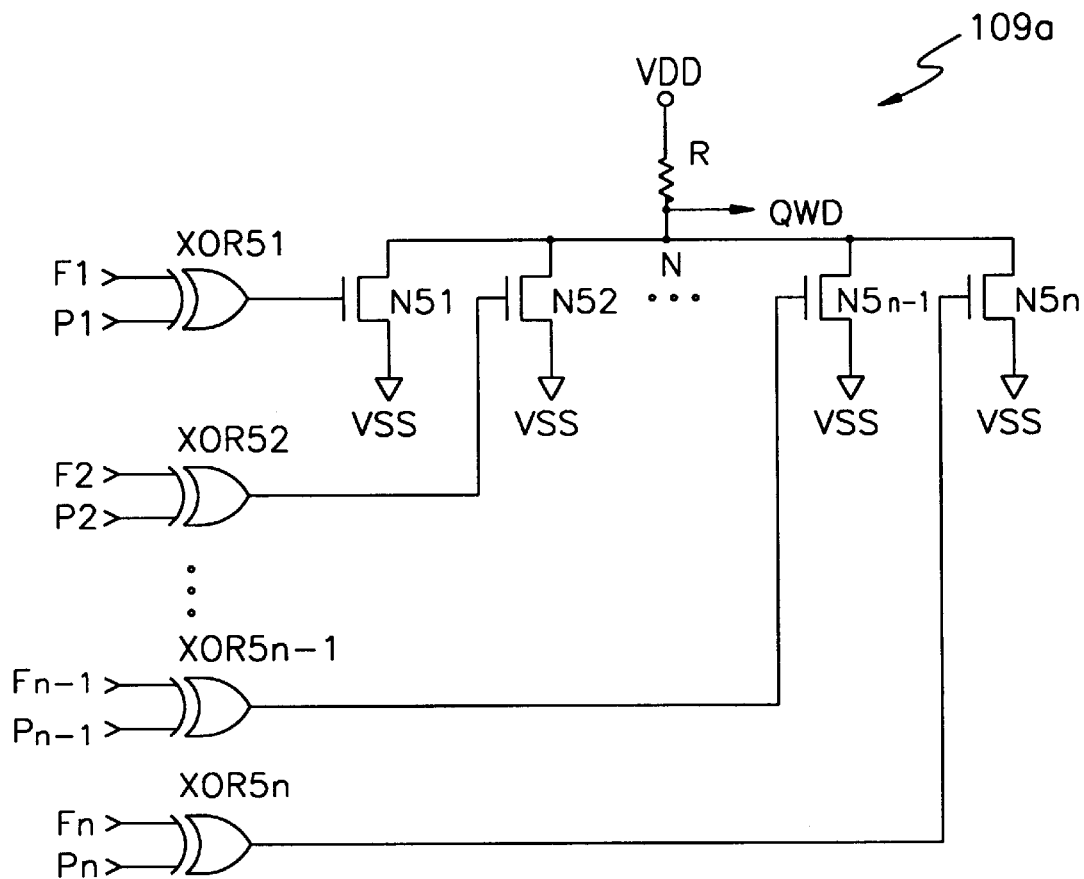
FIG. 5 is an electrical schematic of the first comparator of FIG. 1.
Figure 6:
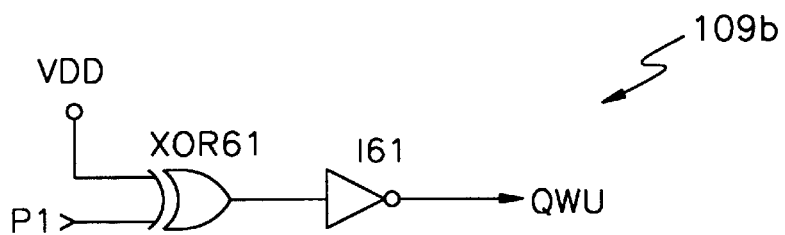
FIG. 6 is an electrical schematic of the second comparator of FIG. 1.

Referring now to FIG. 5, the first comparator 109a will be described. As illustrated, the first comparator 109a comprises a plurality of exclusive OR gates (XOR51–XOR5n) and a plurality of NMOS pull-down transistors N51–N5n, connected as illustrated. As will be understood by those skilled in the art, the output QWD will generate a first equivalence signal QWD at a logic 1 potential only when the digital phase signal F1–Fn equals the digital control signal P1–Pn. Referring now to FIG. 6, the second comparator 109b comprises an exclusive OR gate XOR61 and an inverter I61 connected as illustrated. As will be understood by those skilled in the art, the second comparator 109b will generate a second equivalence signal QWU at a logic 1 potential whenever the first bit of the digital control signal (i.e., P1) is set to a logic 1 potential (i.e., whenever the pointer 107 has been initialized).

Figure 7:
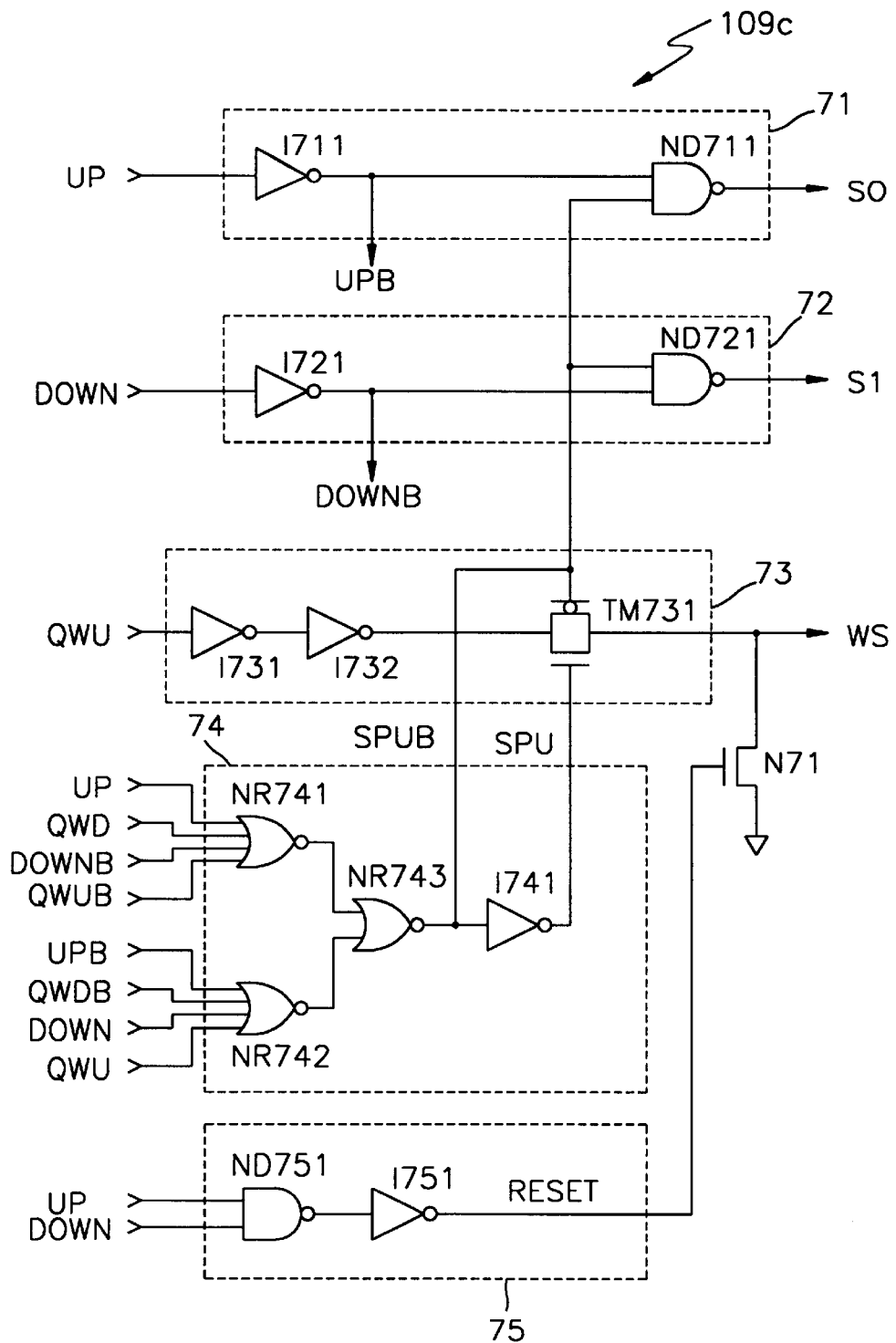
FIG. 7 is an electrical schematic of the command decoder of FIG. 1.

As illustrated best by FIG. 7, the command decoder 109c includes first, second and third pointer control signal generators 71, 72 and 73, a control signal generator 74, a reset signal generator 75, and a pull-down NMOS transistor N71. The first pointer control signal generator 71 includes an inverter I711 and a NAND gate ND711 and generates a first pointer control signal S0 in response to an UP command signal and signal SPUB (where the letter "B" as the last character of the signal name SPUB indicates that the signal is the inverted version of signal SPU). The second pointer control signal generator 72 includes an inverter I721 and a NAND gate ND721 and generates the second pointer control signal S1. The third pointer control signal generator 73 includes inverters I731 and I732 and a transmission gate TM731, and transfers the second equivalence signal QWU of the second comparator 109b as a third pointer control signal WS when the control signal SPU is at a logic 1 potential.

The control signal generator 74 receives the up-command UP, the down-command DOWN, the first equivalence signal QWD, the second equivalence signal QWU, and complementary versions of these signals as UPB, DOWNB, QWDB and QWUB. The control signal generator 74 includes a NOR gate NR741 for receiving the UP, QWD, DOWNB and QWUB signals, a NOR gate NR742 for receiving the UPB, QWDB, DOWN and QWU signals, a NOR gate NR743 for receiving the outputs of the NOR gates NR741 and NR742, and an inverter I741 for inverting the output of the NOR gate NR743 to generate the control signal SPU. The reset signal generator 75 includes a NAND gate ND751 for receiving the up-command UP and the down-command DOWN and an inverter I751 for inverting the output of the NAND gate ND751 to generate a reset signal RESET. The pull-down NMOS transistor N71 pulls down the third pointer control signal WS to logic 0 potential in response to the reset signal RESET. Based on the illustrated configuration of these circuits of FIG. 7, the first, second and third pointer control signals S0, S1 and WS will be generated as illustrated by TABLE 1, where "X" denotes "don't care".

TABLE 1

| UP | 1 | 1 | 0 | 0 | 0 | 1 |
|---|---|---|---|---|---|---|
| DOWN | 0 | 0 | 0 | 1 | 1 | 1 |
| QWD | 0 | 1 (F = P) | X | 0 | 0 | X |
| QWU | 0 | 0 | X | 0 | 1 (P1 = 1) | X |
| S0 | 1 | 1 | 0 | 0 | 1 | 1 |
| S1 | 0 | 1 | 0 | 1 | 1 | 1 |
| WS | X | 0 | X | X | 1 | 0 |
| Pointer Operation | Up | Initialize 1→P1 | Hold | Down | Load F1–Fn | Reset |

Figure 8:
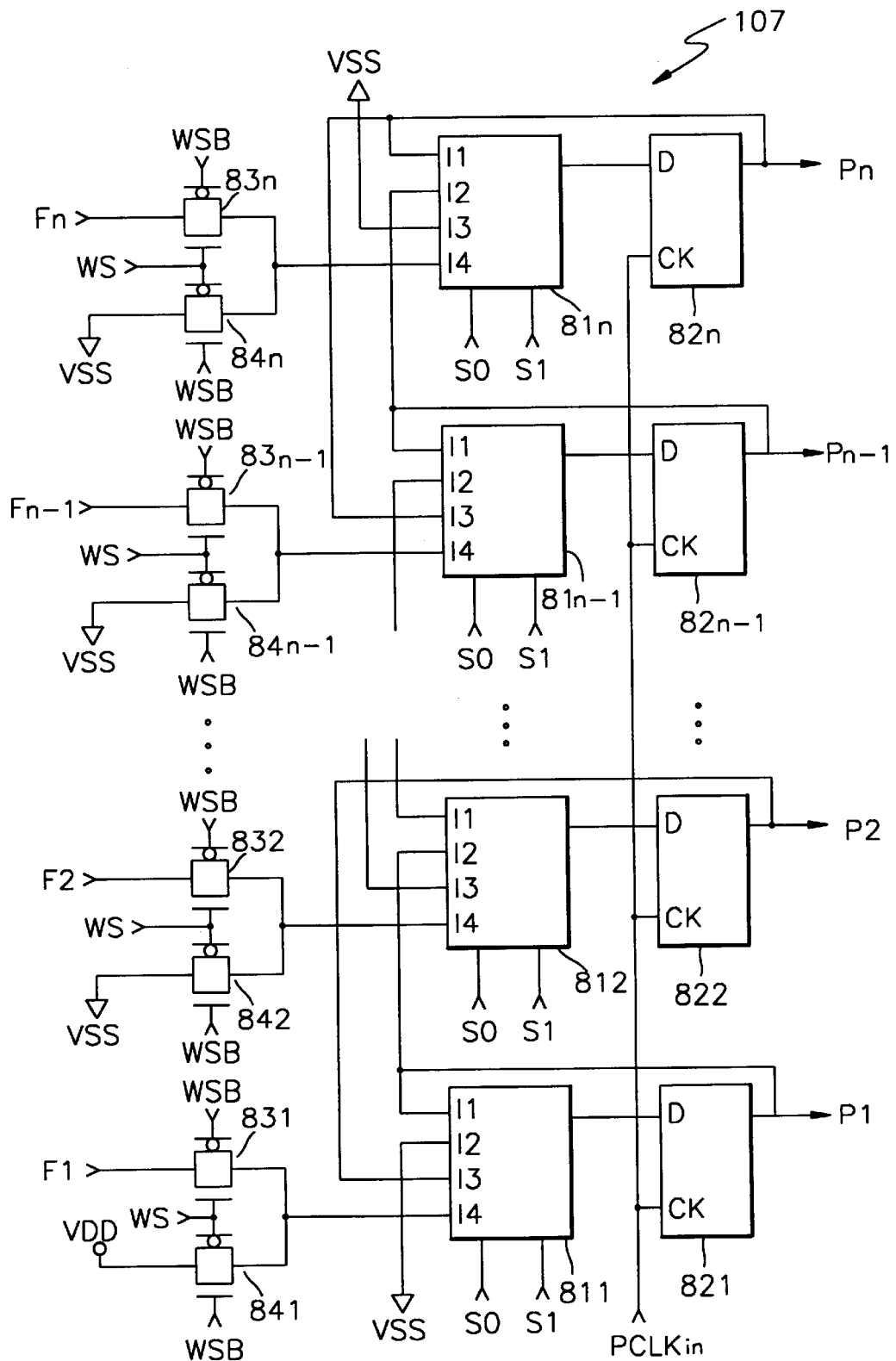
FIG. 8 is an electrical schematic of the pointer of FIG. 1.

Referring now to FIGS. 1 and 8, the operation of the pointer 107 will be more fully described. As illustrated by FIG. 1, the pointer 107 is responsive to the digital phase signal F1–Fn and the first, second and third pointer control signals S0, S1 and WS. The pointer 107 also comprises a plurality of transmission gates 831–83n and 841–84n, a plurality of 2-bit multiplexers 811–81n and a plurality of D-type latches 821–82n, connected as illustrated. Based on this configuration of the pointer 107, the generation of S0, S1 and WS as all logic 1 signals will cause the digital phase signal F1–Fn to be latched into the pointer 107 at a rising edge of the signal PCLKin. Here, and as illustrated best by Table 1 and FIG. 7, the generation of S0, S1 and WS as all logic 1 signals will occur when the UP command, DOWN command, first equivalence signal QWD and second equivalence signal QWU are set to logic levels 0,1,0,1, respectively, which means that a DOWN command is applied to the command decoder 109c while the pointer 107 is in an initialized state. However, the generation of S0, S1 and WS as (1, 1, 0) will cause the reference signals Vss and Vdd to be latched into the pointer 107 at a rising edge of the signal PCLKin. Thus, as illustrated by Table 1, initialization of the pointer 107 can take place whenever the UP and DOWN commands are simultaneously applied to the command decoder 109c or whenever the first equivalence signal QWD is at a logic 1 potential while an UP command is being applied to the command decoder 109c.

Referring still to FIG. 8, the first and second pointer control signals S0 and S1 can be used to select other inputs to the multiplexers 811–81n. For example, when S0 and S1 are set to (0,0), the input 11 of each multiplexer is selected which means a HOLD operation will be performed where the outputs of each D-type latch are fed back into the same latch at each rising transition of signal PCLKin. In addition, when S0 and S1 are set to (1,0), the input 12 of each multiplexer is selected which means the pointer will undergo a count-up sequence where 0→P1, P1→P2 . . . Pn−1 -Pn. In contrast, when S0 and S1 are set to (0,1), the input 13 of each multiplexer is selected which means the pointer will undergo a count-down sequence where 0→Pn, Pn→Pn−1, . . . , P2→P1.

In the drawings and specification, there have been disclosed typical preferred embodiments of the invention and, although specific terms are employed, they are used in a That which is claimed is:

1. A programmable delay line, comprising:
   a delay circuit having an input and a plurality of outputs which each provide a respective delayed version of a periodic input signal provided to the input;
   a delay switch which passes one of the plurality of outputs of said delay circuit to an output thereof, in response to a digital control signal;
   a phase comparing circuit which compares the input signal against the delayed versions of the input signal at the plurality of outputs and generates a digital phase signal that identifies which of the delayed versions of the input signal is in-phase with the input signal;
   a pointer which generates the digital control signal in response to the digital phase signal and a plurality of pointer control signals and the input signal; and
   a first comparator which generates a first equivalence signal if the digital phase signal is equivalent to the digital control signal.

2. The programmable delay line of claim 1, further comprising a second comparator which generates a second equivalence signal if the digital control signal indicates an initialized state of said pointer.

3. The programmable delay line of claim 2, further comprising a command decoder which generates the plurality of pointer control signals in response to up and down command signals and the first and second equivalence signals.

4. The programmable delay line of claim 3, wherein the plurality of pointer control signals cause said pointer to become initialized if the up command signal and the first equivalence signal overlap in time.

5. The programmable delay line of claim 4, wherein the plurality of pointer control signals cause said pointer to become initialized if the up and down command signals overlap in time.

6. The programmable delay line of claim 4, wherein the plurality of pointer control signals cause said pointer to be loaded with the digital phase signal if the down command signal and the second equivalence signal overlap in time.

7. The programmable delay line of claim 6, wherein said delay circuit comprises a plurality of serially connected delay units.

8. The programmable delay line of claim 7, wherein said phase comparing circuit comprises a plurality of phase comparators; and wherein each phase comparator comprises a latch.

9. The programmable delay line of claim 8, wherein each phase comparator comprises a pair of transmission gates; wherein one of the pair of transmission gates turns-on when the periodic input signal transitions from 0→1 and the other of the pair of transmission gates turns-on when the periodic input signal transitions from 1→0.

10. The programmable delay line of claim 9, wherein said pointer comprises a plurality of multiplexers; and wherein an input of each of said plurality of multiplexers receives a respective bit of the digital phase signal when a first pointer control signal is in a first logic state and receives a logic 1 or logic 0 reference signal when the first pointer control signal is in a second logic state, opposite the first logic state.

11. The programmable delay line of claim 10, wherein said pointer comprises a plurality of latches; wherein each of the plurality of latches has an input electrically coupled to an output of a respective multiplexer; and wherein a clock input of each of the plurality of latches is electrically coupled to the input of said delay circuit.

12. The programmable delay line of claim 7, wherein said pointer comprises a plurality of multiplexers; and wherein an input of each of said plurality of multiplexers receives a respective bit of the digital phase signal when a first pointer control signal is in a first logic state and receives a logic 1 or logic 0 reference signal when the first pointer control signal is in a second logic state, opposite the first logic state.

13. The programmable delay line of claim 12, wherein said pointer comprises a plurality of latches; wherein each of the plurality of latches has an input electrically coupled to an output of a respective multiplexer; and wherein a clock input of each of the plurality of latches is electrically coupled to the input of said delay circuit.

14. A programmable delay line, comprising:
   a delay circuit having an input and a plurality of outputs which each provide a respective delayed version of a periodic input signal provided to the input;
   a delay switch which passes one of the plurality of outputs of said delay circuit to an output thereof, in response to a digital control signal;
   a phase comparing circuit which compares the input signal against the delayed versions of the input signal at the plurality of outputs and generates a digital phase signal that identifies which of the delayed versions of the input signal is in-phase with the input signal; and
   a pointer which generates the digital control signal in response to the digital phase signal and a plurality of pointer control signals and the input signal;
   wherein said pointer comprises a plurality of multiplexers; and
   wherein an input of each of said plurality of multiplexers receives a respective bit of the digital phase signal when a first pointer control signal is in a first logic state and receives a logic 1 or logic 0 reference signal when the first pointer control signal is in a second logic state, opposite the first logic state.

15. The programmable delay line of claim 14, wherein said pointer comprises a plurality of latches; wherein each of the plurality of latches has an input electrically coupled to an output of a respective multiplexer; and wherein a clock input of each of the plurality of latches is electrically coupled to the input of said delay circuit.

16. A programmable delay line, comprising:
   a delay circuit having an input and a plurality of outputs which each provide a respective delayed version of a periodic input signal provided to the input;
   a delay switch which passes one of the plurality of outputs of said delay circuit to an output thereof, in response to a digital control signal;
   a phase comparing circuit which compares the input signal against the delayed versions of the input signal at the plurality of outputs and generates a digital phase signal that identifies which of the delayed versions of the input signal is in-phase with the input signal; and
   a pointer which generates the digital control signal in response to the digital phase signal and a plurality of pointer control signals and the input signal;
   wherein said phase comparing circuit comprises a plurality of phase comparators;
   wherein each phase comparator comprises a latch and a pair of transmission gates; wherein one of the pair of transmission gates turns-on when the periodic input signal transitions from 0→1 and the other of the pair of transmission gates turns-on when the periodic input signal transitions from 1→0;

wherein said pointer comprises a plurality of multiplexers; and wherein an input of each of said plurality of multiplexers receives a respective bit of the digital phase signal when a first pointer control signal is in a first logic state and receives a logic 1 or logic 0 reference signal when the first pointer control signal is in a second logic state, opposite the first logic state.

17. The programmable delay line of claim 16, wherein said pointer comprises a plurality of latches; wherein each of the plurality of latches has an input electrically coupled to an output of a respective multiplexer; and wherein a clock input of each of the plurality of latches is electrically coupled to the input of said delay circuit.

* * * * *

UNITED STATES PATENT AND TRADEMARK OFFICE
CERTIFICATE OF CORRECTION

PATENT NO. : 6,232,812 B1　　　　　　　　　　　　　　　　　　　　　　　Page 1 of 1
DATED       : May 15, 2001
INVENTOR(S) : Jung-bae Lee It is certified that error appears in the above-identified patent and that said Letters Patent is hereby corrected as shown below:

<u>Column 7,</u>
Line 54, please change "tums-on" to -- turns-on --.

<u>Column 8,</u>
Line 4, please change "7" to -- 9 --.

Signed and Sealed this

Fourteenth Day of May, 2002

*Attest:*

*Attesting Officer*　　　　JAMES E. ROGAN
　　　　　　　　　　　*Director of the United States Patent and Trademark Office*